(12) United States Patent
Chuanyang et al.

(10) Patent No.: US 12,224,133 B2
(45) Date of Patent: Feb. 11, 2025

(54) SWITCH MECHANISM

(71) Applicant: Peratech IP Ltd., North Yorkshire (GB)

(72) Inventors: Zhang Chuanyang, Jiansu (CN); Xu Feng, Jiansu (CN); Zhang Heng, Jiansu (CN); Li Zefeng, Jiansu (CN)

(73) Assignee: Peratech IP Ltd, North Yorkshire (GB)

( * ) Notice: Subject to any disclaimer, the term of this patent is extended or adjusted under 35 U.S.C. 154(b) by 0 days.

(21) Appl. No.: 17/783,706

(22) PCT Filed: Dec. 9, 2020

(86) PCT No.: PCT/GB2020/000096
§ 371 (c)(1),
(2) Date: Jun. 9, 2022

(87) PCT Pub. No.: WO2021/116639
PCT Pub. Date: Jun. 17, 2021

(65) Prior Publication Data
US 2023/0005679 A1    Jan. 5, 2023

(30) Foreign Application Priority Data
Dec. 9, 2019    (CN) .......................... 201922194117.9

(51) Int. Cl.
*H01H 13/20*    (2006.01)
*H01H 13/14*    (2006.01)

(52) U.S. Cl.
CPC ............ *H01H 13/20* (2013.01); *H01H 13/14* (2013.01); *H01H 2235/01* (2013.01)

(58) Field of Classification Search
CPC .... H01H 13/20; H01H 13/14; H01H 2235/01; H03K 2217/96023; H03K 2217/96027; H03K 2217/9651; H03K 17/965; H03K 17/9625
See application file for complete search history.

(56) References Cited

U.S. PATENT DOCUMENTS

| 10,797,622 | B2 * | 10/2020 | Hikawa ..................... H02P 6/08 |
| 2003/0066741 | A1 | 4/2003 | Burgess et al. |
| 2022/0181100 | A1 * | 6/2022 | Fujihara ..................... B25F 5/02 |
| 2023/0045318 | A1 * | 2/2023 | Castillo Buenaventura ................ H01H 50/18 |

FOREIGN PATENT DOCUMENTS

CN    108023584 A    5/2015

OTHER PUBLICATIONS

Corresponding International Patent Application No. PCT/GB2020/000096, International Search Report dated Feb. 18, 2021.

* cited by examiner

*Primary Examiner* — Lheiren Mae A Caroc
(74) *Attorney, Agent, or Firm* — Cooper Legal Group LLC (57) ABSTRACT

An apparatus for providing a switch mechanism comprises a housing and a pressure sensitive device mounted to the housing. An actuator is moveably connected to the housing to enable the actuator to move along an axis towards and away from the pressure sensitive device. A resilient member has a first end connected to the actuator and a second end connected to the pressure sensitive device.

17 Claims, 8 Drawing Sheets

SWITCH MECHANISM

CROSS REFERENCE TO RELATED APPLICATIONS

This application claims priority from Chinese Utility Model number ZL 2019 22 194 117.9, filed on 9 Dec. 2019, the whole contents of which are incorporated herein by reference.

BACKGROUND OF THE INVENTION

The present invention relates to an apparatus for providing a switch mechanism, an electric power tool and a method of operating an electric power tool.

Electric power tools, such as electric drills or electric screwdrivers, are often provided in hand-held form and utilized by means of an operating switch providing an on/off mechanism or a variable switch allowing adjustment of the speed of rotation of the working head of the power tool.

Electric power tools of this type typically comprise a housing which can be gripped and held by an operative, often with a power source such as a battery provided at a lower end of the housing. An input device, such as a push button, is generally provided on an outer surface of the housing which the operative can press. The input device has a speed control switch connected to it for operation of the speed of the working head.

Conventional power tool switches of this type utilize reed switches having a contact piece and a resistance plate. Resistance is controlled by adjustment of the location of the contact piece on the resistance plate.

A problem exists in that the contact piece and resistance plate wear due to repeated abrasion in use leading to failure of the switch. Thus, the present invention aims to improve upon this problem.

BRIEF SUMMARY OF THE INVENTION

According to a first aspect of the present invention, there is provided an apparatus for providing a switch mechanism.

According to a second aspect of the present invention, there is provided a method of operating an electric power tool.

Embodiments of the invention will be described, by way of example only, with reference to the accompanying drawings. The detailed embodiments show the best mode known to the inventor and provide support for the invention as claimed. However, they are only exemplary and should not be used to interpret or limit the scope of the claims. Their purpose is to provide a teaching to those skilled in the art. Components and processes distinguished by ordinal phrases such as "first" and "second" do not necessarily define an order or ranking of any sort.

DETAILED DESCRIPTION OF EMBODIMENTS OF THE INVENTION

Figure 1:
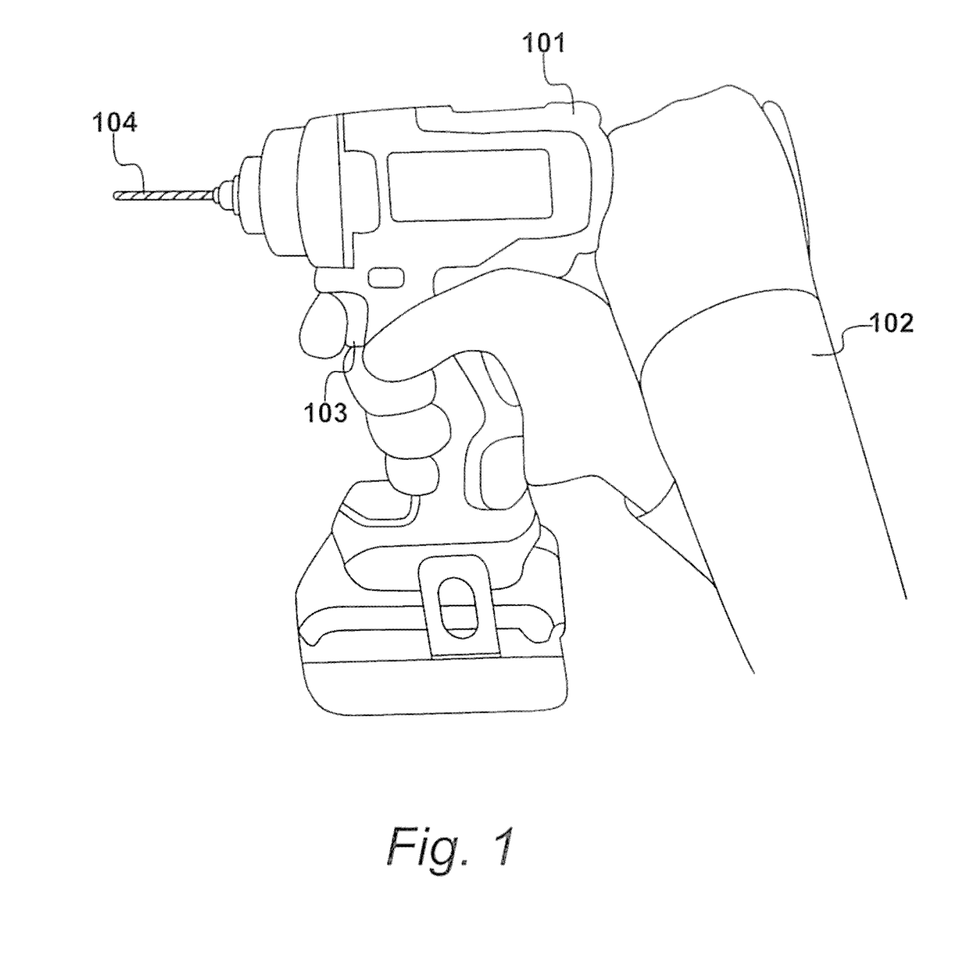
FIG. 1 shows an operative in operation with an electric power tool.

FIG. 1

FIG. 1 shows an electric power tool 101, which, in this case is an electric drill. Electric power tool 101 is configured to be hand-held by an operative 102 and operated by an input device 103 which comprises a push button.

In use, the operative 102 operates electric power tool 101 by applying a force to input device 103 which enables the rotation of drill bit 104.

In conventional applications input device 103 activates a switch which provides an on/off operation of the rotation of drill bit 104. However, in the present invention, the input device 103 provides an improved control for the operative 102 of the rotation of drill 104 by means of input device 103.

Figure 2:
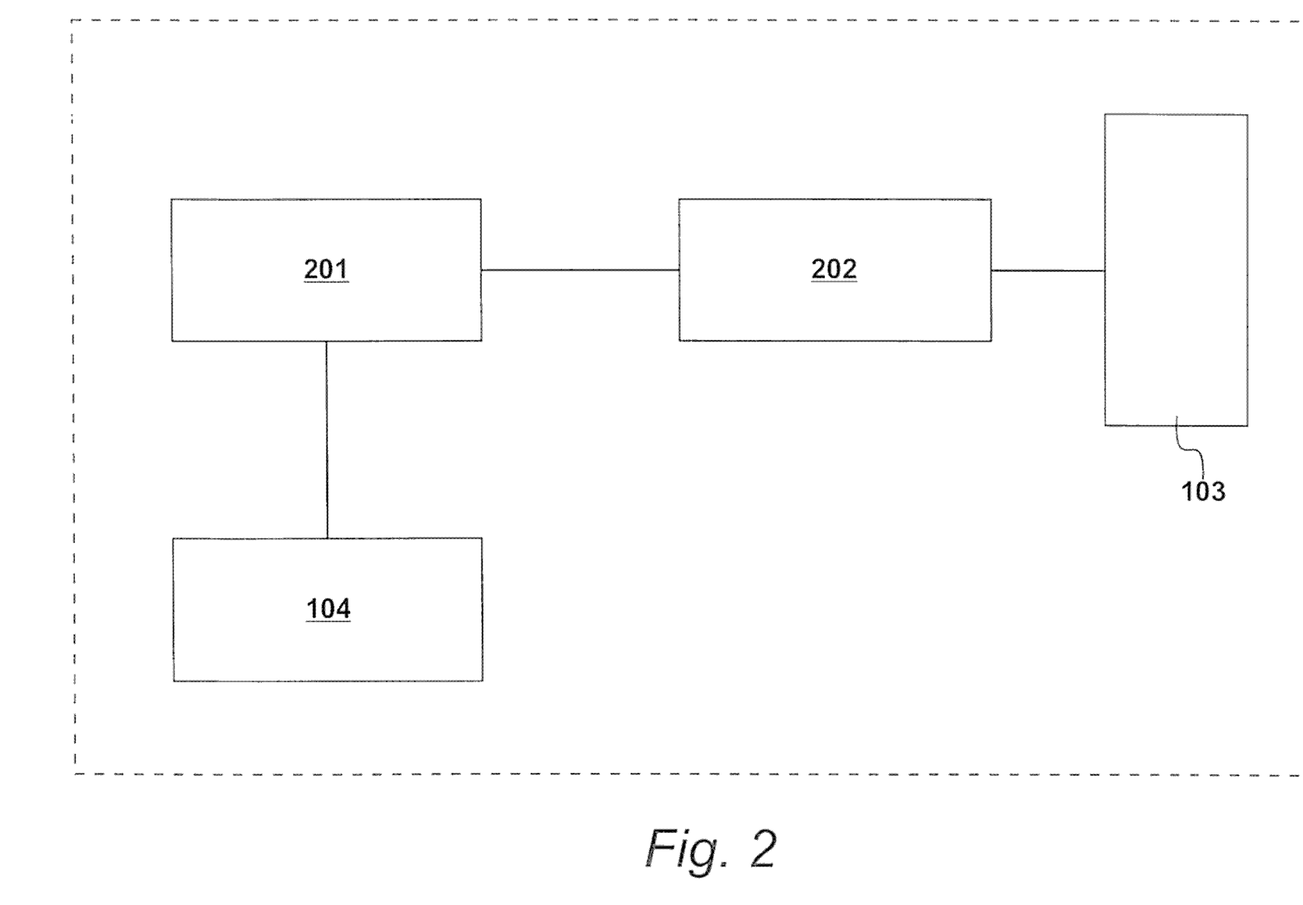
FIG. 2 shows a schematic of an electric power tool.

FIG. 2

A schematic of electric power tool 101 in accordance with the present invention is illustrated in FIG. 2.

In the embodiment, electrical power tool 101 comprises an electric circuit 201 which is connected to a pressure sensitive device 202 which is connected to the input device 103.

Electric circuit 201 is further connected to the drill bit 104 of electric power tool 101 such that a signal can be transmitted to drill bit 104 to provide an indication of rotation.

In the embodiment, when operative 102 provides a force to input device 103 a pressure is applied to pressure sensitive device 202 which communicates with electric circuit 201 such that a signal may be transmitted from electric circuit 201 to provide an output such as the rotation of the drill bit 104.

It is appreciated that the invention described herein relates to an electric power tool but is not specifically limited to an electric drill and rotation of drill bit. It is appreciated that the apparatus described herein and specifically the switch mechanism may therefore be utilized in alternative embodiments and alternative power tool and may further be utilized for alternative operations other than the rotation of a device.

For example, in alternative embodiments, the switch mechanism is incorporated into an electric screwdriver which outputs a rotation of the screwdriver in accordance with the invention. In a still further embodiment, the electric power tool may provide an output by means of the movement of a hammer.

Figure 3:
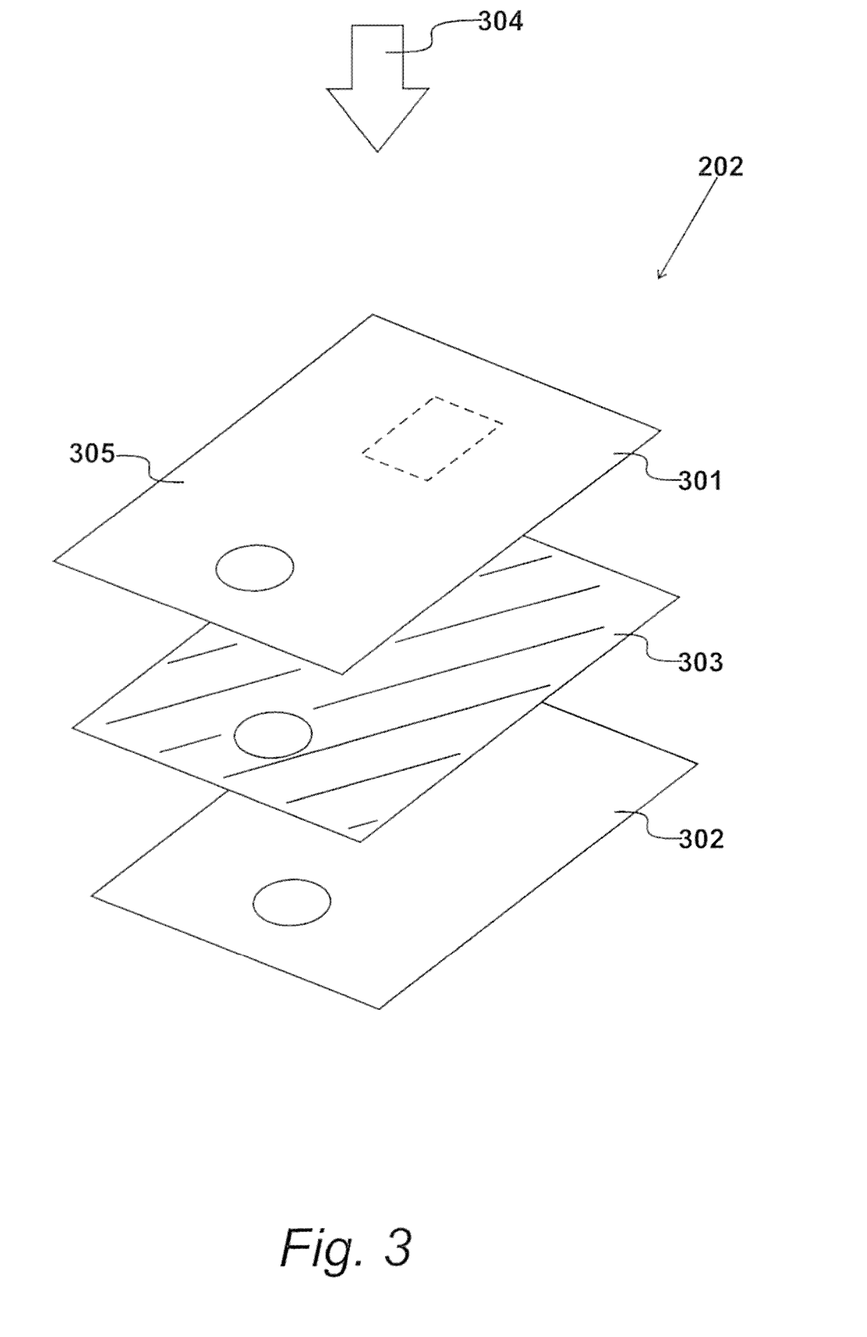
FIG. 3 shows and exploded schematic view of a pressure sensitive device.

FIG. 3

An example pressure sensitive device 202 is shown in exploded schematic form in FIG. 3.

In the embodiment, pressure sensing device 202 is a single point pressure sensor and, in this embodiment provides a resistive pressure sensor.

In the embodiment, pressure sensitive device 202 comprises a first conductive layer 301, a second conductive layer 302 and a pressure sensitive resistive layer 303.

In the embodiment, pressure sensitive resistive layer 303 comprises a quantum tunnelling material such as that available under the present applicant Peratech Holdco Limited.

Each of the conductive layers 301 and 302 comprise a conductive material which, in an embodiment, comprises a carbon ink and/or a silver-based ink.

When a force is applied in the direction of arrow 304 the force is transmitted from conductive layer 301 to conductive layer 302 via pressure sensitive resistive layer 303.

Pressure sensitive resistive layer 303 is configured to exhibit a change in resistance in response to an applied force. In this way, by connecting pressure sensing device to an appropriate electric circuit and measuring the resistive output, a magnitude and/or position of force may be calculated from the output resistance.

Figure 4:
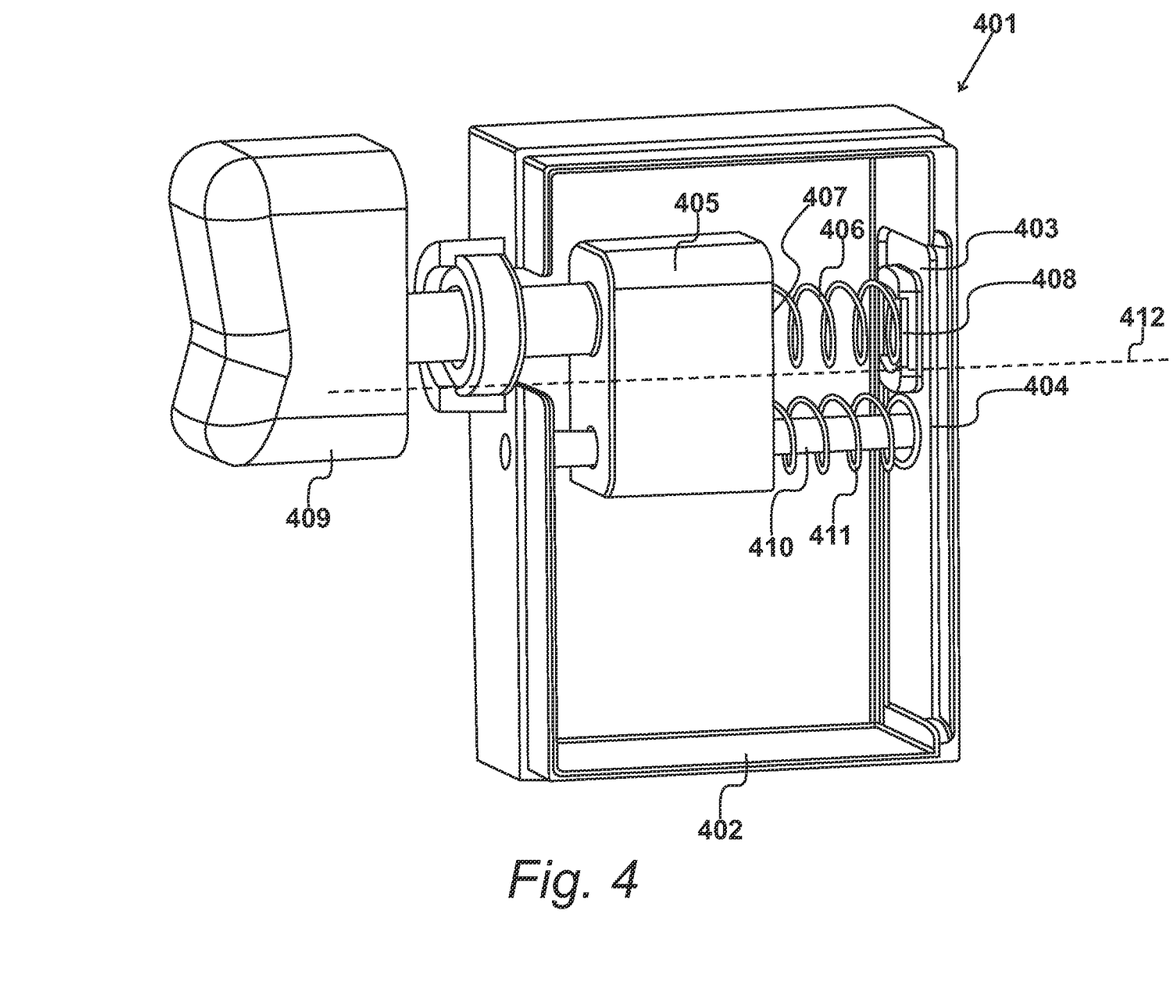
FIG. 4 shows an apparatus for providing a switch mechanism.

FIG. 4

An apparatus for providing a switch mechanism is shown in a perspective view with partial cutaway in FIG. 4.

Apparatus 401 comprises a housing 402 and a pressure sensitive device 403 mounted to housing 402. In the embodiment, pressure sensitive device 403 comprises a resistive pressure sensor which may be substantially similar to pressure sensitive device 202 described previously with respect to FIG. 3.

In the embodiment, housing 402 is provided with a groove 404 which is configured to receive the pressure sensitive device 403. This provides a means in manufacture for accurate placement pressure sensitive device 403.

Apparatus 401 further comprises an actuator 405 which is movably connected to housing 402. In the embodiment, actuator 405 is configured to move along an axis 412 towards and away from pressure sensitive device 403.

Apparatus 401 further comprises a resilient member 406 which, in this embodiment, is a spring. Resilient member 406 comprises a first end 407 which is connected to actuator 405 and a second end 408 which is connected to pressure sensitive device 403.

Actuator 405 is further connected to an input device 409 which comprises a push button substantially similar to conventional electric tool push buttons.

In an embodiment, apparatus 401 further comprises a guide rod 410 which is attached to housing 402 and fixed to actuator 405. Guide rod 410 is positioned perpendicular to the pressure surface 305 of the pressure sensitive device 403. A second resilient member 411 is sleeved over the guide rod 410. In the embodiment, resilient member 411 again comprises a spring and is utilized to increase resilience upon application of a force to input device 409.

In an embodiment, resilient member 411 is provided between the actuator 405 and housing 402.

Figure 5:
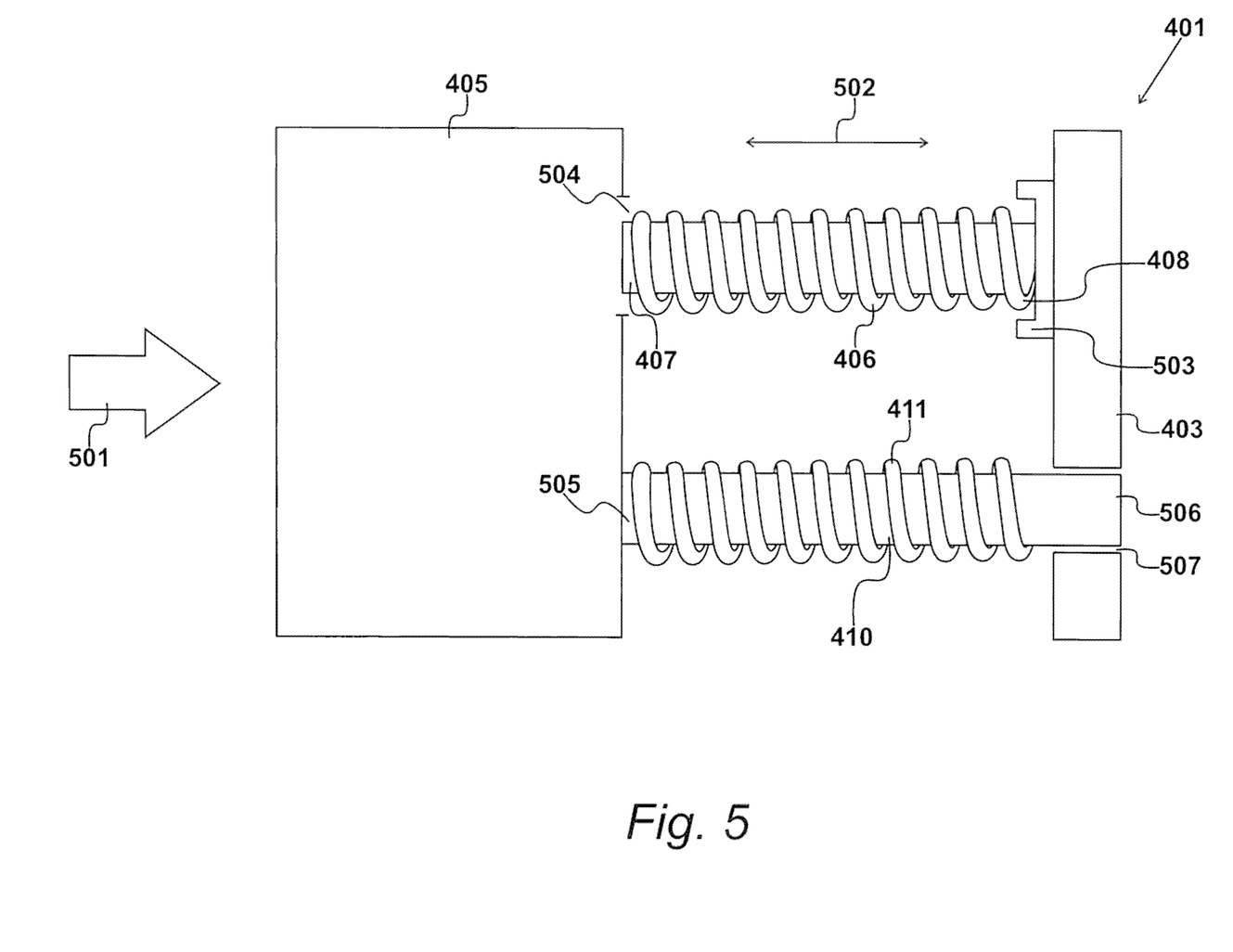
FIG. 5 shows a cross-sectional diagrammatic view of the apparatus of FIG. 4.

FIG. 5

Apparatus 401 is shown in a cross-sectional diagrammatic view in FIG. 5.

In the embodiment, when an operative applies a force 501 to the input device 409, this force is transmitted to actuator 405 which can move along an axis in the direction of arrow 502.

Apparatus 401 further comprises a positioning structure 503 which forms part of pressure sensitive device for 403 and which is attached thereto. Positioning structure 503 is configured to receive resilient number 406 at end 408. In addition, actuator 405 comprises a positioning hole 504 at end 407 in which resilient member 406 is also positioned. This ensures that resilient member 406 is securely positioned to actuator 405 such that as actuator 405 moves in the direction of arrow 502, resilient member 406 is substantially retained to actuator 405 and pressure sensitive device 403.

Positioning structure 503 is provided on pressure surface 305 of pressure sensitive device 403.

The embodiment of FIG. 5 further illustrates the guide rod 410 which is positioned perpendicular to pressure surface 305 and pressure sensitive device 403. As shown, guide rod 403 is fixed to actuator 405 at end 505. At end 506 of guide rod 410 pressure sensitive device 403 comprises an opening 507 into which guide rod 410 is received. In this way, guide rod 410 does not affect the resistive output from pressure sensitive device 403.

In the embodiment shown in FIG. 5 apparatus 401 is shown in a rest position in which resilient member 406 and actuator 405 are resiliently biased away from pressure sensitive device 403 by means of resilient member 406. Resilient member 411, provided between actuator 405 and the housing of apparatus 401 also works to bias actuator 405 away from pressure sensitive device 403.

Thus, in this rest position, force 501 is not transmitted to pressure sensitive device 403 and the output from pressure sensitive device 403 does not activate the electric power tool by means of its electric circuit. When force 501 is applied, an output from pressure sensitive device can be made as will be described further with respect to FIG. 6.

Figure 6:
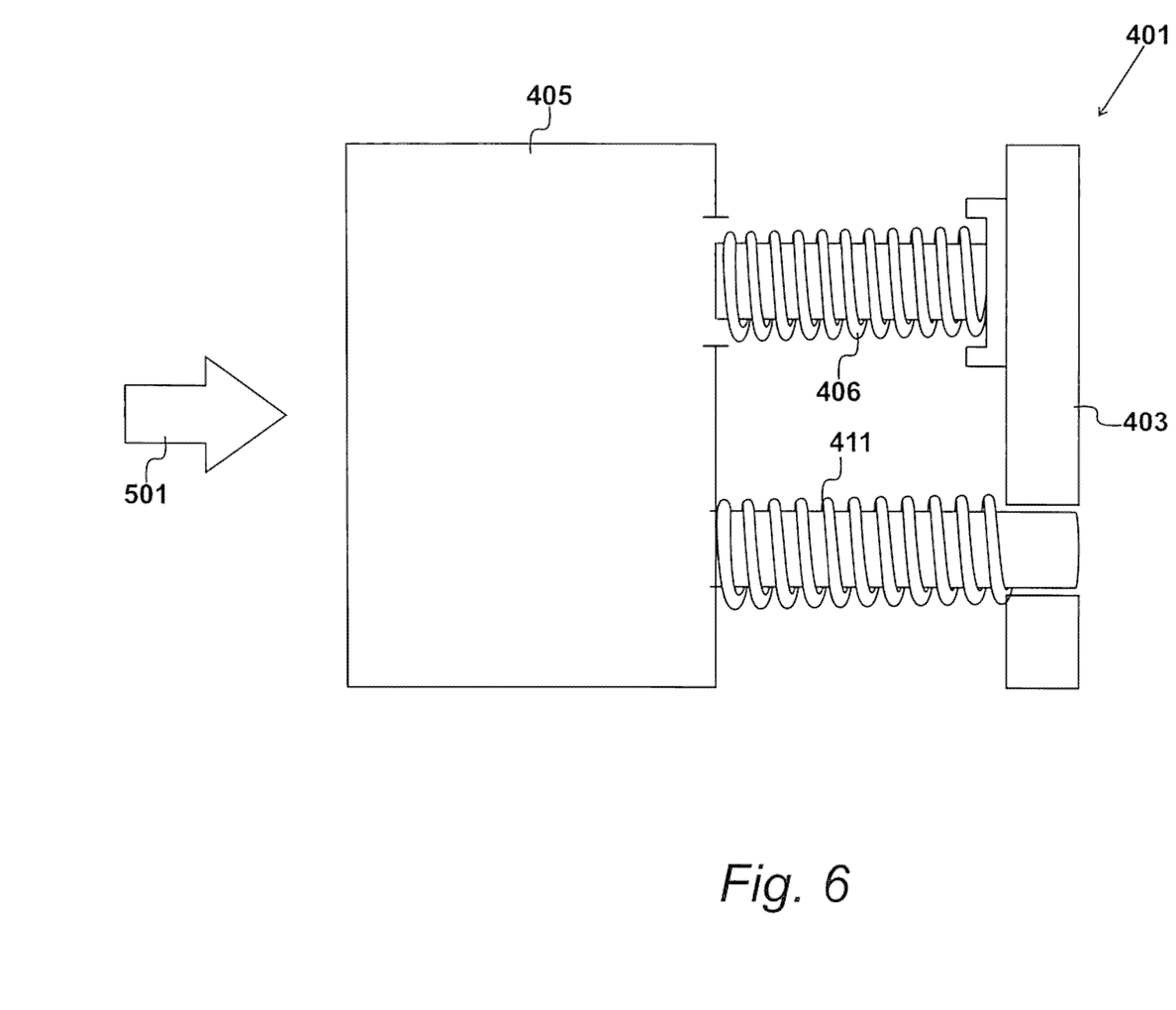
FIG. 6 shows the apparatus of FIG. 5 in a compressed configuration following the application of a force.

FIG. 6

A substantially similar view of apparatus 401 is shown in FIG. 6 in which force 501 has been applied by means of input device 409 to actuator 405. The force applied to actuator 405 has led to resilient members 406 and 411 being compressed as illustrated thereby transmitting force 501 to pressure sensitive device 403.

In this way, a change in the electrical signal from pressure sensitive device 403 can be recorded by means of electrical circuit 201 which can be utilized to activate the electric power tool, for example, by indicating a rotational speed of drill bit 104.

Figure 7:
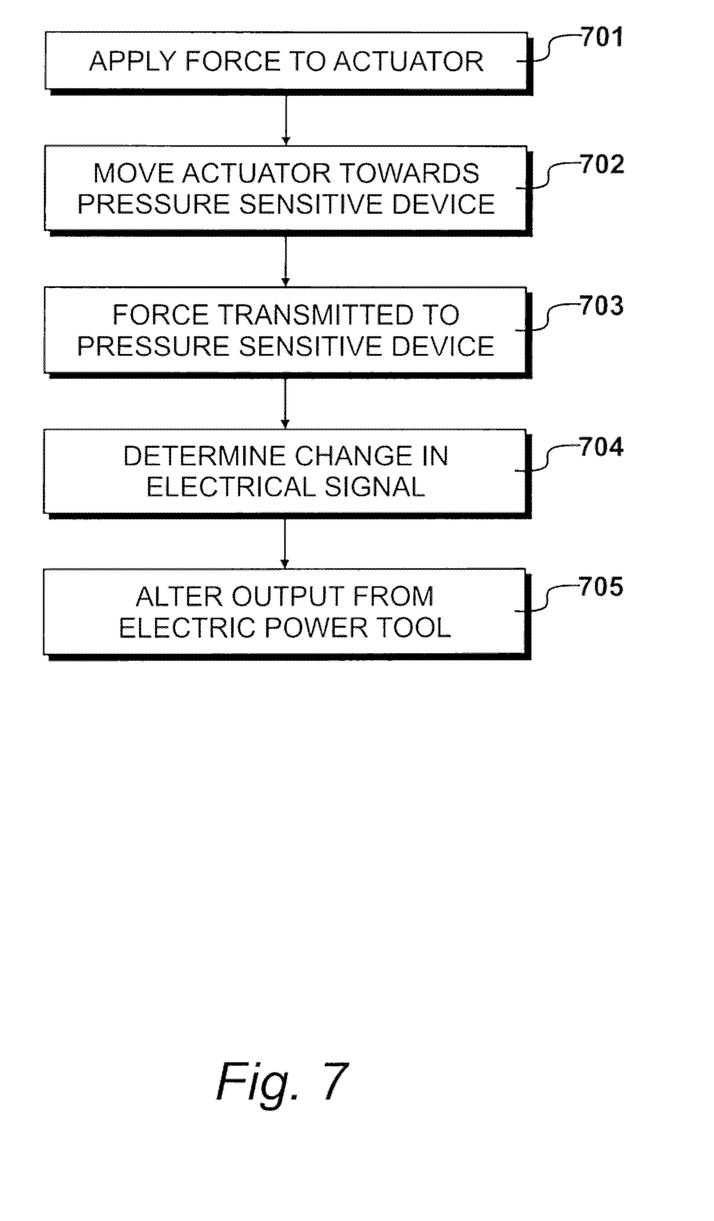
FIG. 7 shows a method of operating an electric power tool incorporating the apparatus previously described.

FIG. 7

A method of operating an electric power tool incorporating apparatus 401 described previously is shown in FIG. 7.

At step 701, a force such as force 501 is applied to actuator 405. In practice, operative 102 applies a force to input device 409 which is transmitted to actuator 405.

At step 702 actuator 405 moves along axis 412 in the direction of arrow 502 towards pressure sensitive device 403. This compresses resilient member 403 such that, at step 703 a force is transmitted to pressure sensitive device 403.

At step 704, a change in electrical signal from pressure sensitive device 403 is determined by electric circuit 201 by utilizing the change in resistance recorded from pressure sensitive device 403.

At step 705, the output from the electric power tool is altered in response to the change in the electrical signal.

In this way, the pressure sensitive device permits a change in applied pressure to affect the speed, rotation or other parameter in regards to the output from electric power tool.

Figure 8:
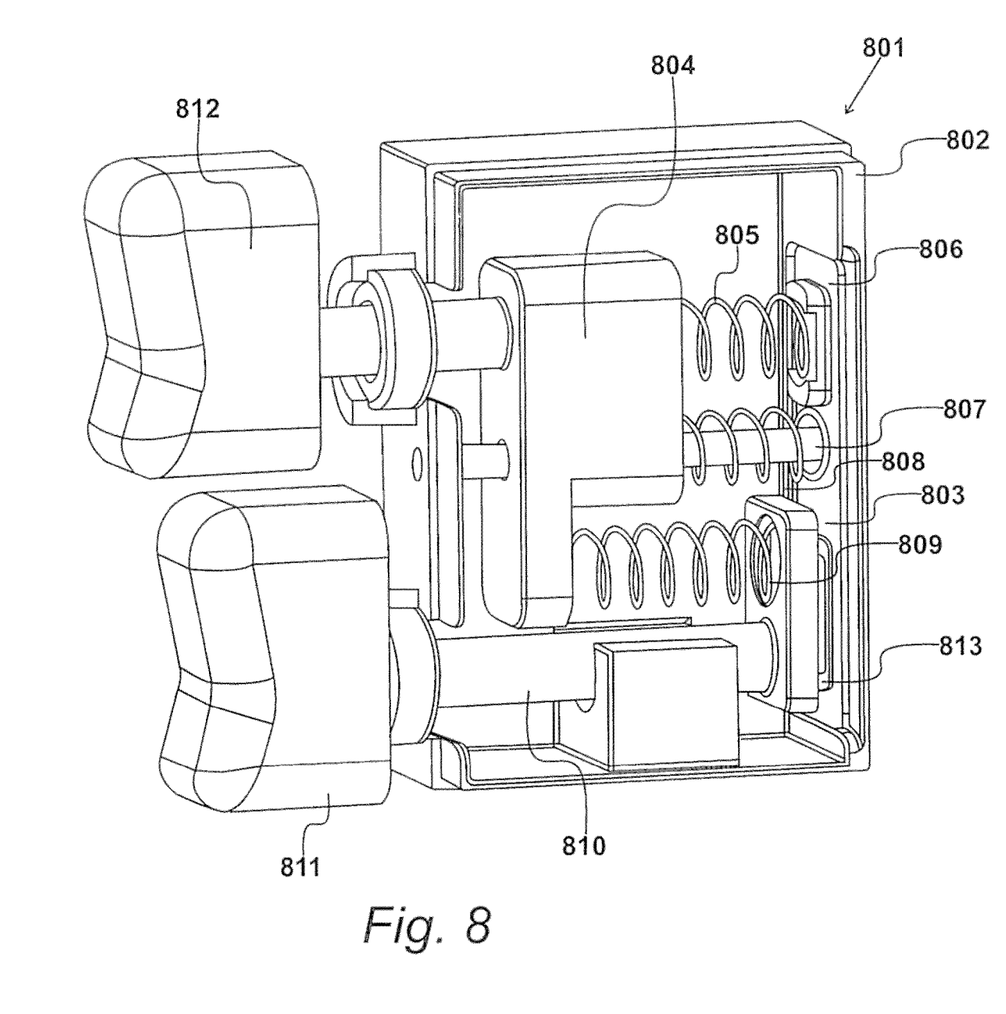
FIG. 8 shows a further embodiment of an apparatus for providing a switch mechanism.

FIG. 8

A further embodiment in accordance with the invention is shown in FIG. 8.

Apparatus 801 provides a switch mechanism suitable for an electrical power tool. In the embodiment, apparatus 801 comprises a housing 802 and a pressure sensitive device 803 which is mounted to housing 802. In the embodiment, pressure sensitive device 803 comprises a resistive pressure sensor and, in this embodiment is a dual-point sensor. This means that pressure sensitive device records an applied pressure at two points of the sensing device.

Apparatus 801 comprises a first actuator 804 which is moveably connected to housing 802 such that actuator 804 can move along an axis towards and away from pressure sensitive device 803 in a substantially similar manner to the embodiment of apparatus 401.

Apparatus 801 further comprises a first resilient member 805 which is substantially similar to resilient member 406 described previously. Thus, resilient member 805 is connected at a first end to actuator 804 and to pressure sensitive device 803 at a second end.

In a substantially similar manner, housing 802 comprises a groove 806 which is configured to receive pressure sensitive device 803. Groove 806 is provided on an inner wall of housing 802.

In the embodiment, apparatus 801 comprises a guide rod 807 which is attached to housing 802 and is positioned perpendicular to the pressure surface of pressure sensitive device 803. Guide rod 807 is fixed to actuator 804 at one end and housing 802 at the opposite end. Resilient member 808 is sleeved on guide rod 807. Actuator 804 is resiliently biased away from pressure sensitive device 803 by means of resilient member 805 and resilient member 808.

In this embodiment, apparatus 801 further comprises a further resilient member 809 which is positioned between actuator 804 and pressure sensitive device 803.

A second actuator 810 is also provided and is connected to an input device 811 at one end with the opposite end of actuator 810 abutting against pressure sensitive device 803.

Thus, in this way, apparatus 801 comprises first and second input devices 811 and 812 which can be operated by operative 102.

In this embodiment, when a force is applied to input device 812 resilient members 805, 808 and 809 are compressed to activate separate points on the pressure sensitive device 803 simultaneously. This provides increased control from the input device 812 for operative 102.

When operative 102 applies force to input device 811, pressure is exerted on pressure sensitive device 803 in region 813 thereby providing an alternative response. This therefore gives apparatus 801 two separate modes which provide an increased range. When applying force to input device 811, the lack of resilient members included reduces the effort required by operative 102. However, for increased sensitivity input device 812 may be utilized to provide increased control.

The invention claimed is:

1. Apparatus for providing a switch mechanism, comprising:
    a housing containing within:
        a pressure sensitive device comprising a resistive pressure sensor responsive to an applied force, said pressure sensitive device being mounted to said housing;
        a first actuator moveably connected to said housing to enable said first actuator to move along an axis towards and away from said pressure sensitive device, so as to transmit said applied force to said pressure sensitive device; and
        a first resilient member having a first end connected to said first actuator and a second end connected to said pressure sensitive device, wherein
            said housing comprises a groove configured to receive said pressure sensitive device such that said pressure sensitive device is positioned accurately in manufacture; and
            said pressure sensitive device comprises a positioning structure configured to receive said first resilient member so as to retain said first resilient member to said pressure sensitive device;
    a guide rod attached to said housing, said guide rod being positioned perpendicular to a pressure surface of said pressure sensitive device; and
    a second resilient member sleeved on said guide rod.

2. The apparatus of claim 1, wherein said groove is provided on an inner wall of said housing.

3. The apparatus of claim 1, wherein said first resilient member comprises a spring.

4. The apparatus of claim 1, wherein said first actuator comprises a positioning hole and said first resilient member is positioned in said positioning hole at said first end and positioned in said positioning structure at said second end.

5. The apparatus of claim 1, wherein said positioning structure is provided on said pressure surface of said pressure sensitive device.

6. The apparatus of claim 1, wherein said guide rod is fixed to said first actuator.

7. The apparatus of claim 1, wherein said first actuator is resiliently biased away from said pressure sensitive device by means of said first resilient member.

8. The apparatus of claim 1, wherein said second resilient member is provided between said first actuator and said housing.

9. The apparatus of claim 8, wherein said first actuator is resiliently biased away from said pressure sensitive device by means of said second resilient member.

10. The apparatus of claim 8, wherein said second resilient member comprises a spring.

11. The apparatus of claim 1, further comprising a first input device connected to said first actuator.

12. The apparatus of claim 1, further comprising a second actuator; wherein a first end of said second actuator abuts against said pressure sensitive device.

13. The apparatus of claim 12, further comprising a second input device connected to said second actuator.

14. The apparatus of claim 1, further comprising a third resilient member positioned between said first actuator and said pressure sensitive device.

15. The apparatus of claim 1, wherein said pressure sensitive device is connected to an electrical circuit of an electric power tool.

16. An electric power tool comprising the apparatus of claim 1.

17. A method of operating an electric power tool comprising an apparatus comprising a housing containing within a pressure sensitive device, a first actuator, and a first resilient member, a guide rod and a second resilient member, said housing comprising a groove in which said pressure sensitive device is received accurately in manufacture, said pressure sensitive device comprising a positioning structure which receives said first resilient member, said guide rod attached to said housing and positioned perpendicular to a pressure surface of said pressure sensitive device, and said second resilient member sleeved on said guide rod, said method comprising the steps of:
    applying a force to said first actuator which is moveably connected to said housing of said apparatus;
    moving said first actuator to compress said first resilient member and said second resilient member, said first resilient member being connected to said pressure sensitive device;
    transmitting said force to said pressure sensitive device;
    determining a change in electrical signal from said pressure sensitive device; and
    altering an output from said electric power tool in response to said change in electrical signal.

* * * * *